United States Patent [19]

Upadhyayula et al.

[11] 3,832,652

[45]* Aug. 27, 1974

[54] DYNAMIC DIVIDING CIRCUIT FOR DIVIDING AN INPUT FREQUENCY BY AT LEAST THREE

[75] Inventors: Chainulu Lakshiminarasimha Upadhyayula, East Windsor; Subrahmanyam Yegna Narayan, Belle Mead, both of N.J.

[73] Assignee: RCA Corporation, Princeton, N.J.

[ * ] Notice: The portion of the term of this patent subsequent to Aug. 27, 1991, has been disclaimed.

[22] Filed: Jan. 19, 1973

[21] Appl. No.: 325,072

[52] U.S. Cl. .......... 331/107 G, 321/69 NL, 331/51, 331/55

[51] Int. Cl. .......................... H03b 3/08, H03b 7/14

[58] Field of Search ............ 331/51, 52, 55, 107 G; 321/69 R, 69 NL; 307/88.3

[56] References Cited

UNITED STATES PATENTS

| | | | |
|---|---|---|---|
| 3,365,583 | 1/1968 | Gunn | 331/107 G X |
| 3,486,132 | 12/1969 | Yu | 331/107 G |
| 3,558,923 | 1/1971 | Uenohara | 331/107 G X |

OTHER PUBLICATIONS

Stickler, Proceedings of the IEEE, October 1969, pp. 1,772, 1,773.

*Primary Examiner*—John Kominski
*Assistant Examiner*—Siegfried H. Grimm
*Attorney, Agent, or Firm*—Donald S. Cohen; Glenn H. Bruestle

[57] ABSTRACT

A circuit is presented which has the capability of dividing an input frequency by an integer in order to achieve an output frequency within a specified range. This dynamic dividing circuit is capable of multigigabit rate operation.

14 Claims, 3 Drawing Figures

DYNAMIC DIVIDING CIRCUIT FOR DIVIDING AN INPUT FREQUENCY BY AT LEAST THREE

BACKGROUND OF THE INVENTION

The invention herein disclosed was made in the course of or under a contract or subcontract thereunder with the Department of the Air Force.

The present invention relates to frequency dividing circuits and more particularly related to frequency dividing circuits which operate at multi-gigabit rates.

In the past, frequency division circuits have been limited in capability by device constraints. In particular, most logic circuitry has been constructed using silicon semiconductor devices. This has limited the speed of the devices as a result of the electron mobility in silicon and the required electric field for obtaining velocity saturation in silicon.

It has been learned that some semiconductors such as gallium arsenide, indium phosphide and other III-V compounds have a much higher electron mobility than silicon, while requiring a much lower electric field for obtaining electron velocity saturation compared to silicon. Consequently, such devices have a lower delay-dissipation product than do silicon devices. Furthermore, gallium arsenide can be obtained in a semi-insulating form which has excellent dielectric properties even at high microwave frequencies. This means that semiconducting gallium arsenide can be grown homo-epitaxially upon semi-insulating gallium arsenide with no lattice mismatch problems.

In addition to the general advantages of certain III–V compounds such as gallium arsenide over silicon as a semiconductor, there is a physical phenomenon which exists in these compounds but not in silicon which may be used for high speed logic applications. This phenomenon is such that when there is applied in a body of the material an electric field higher than a threshold value determined by the material, a high field domain is formed in the material and travels through the body under the influence of the applied voltage to result in a temporary decrease in current flow through the body. The effect is commonly referred to as the transferred electron effect. Devices that take advantage of the transferred electron effect are called "Gunn-effect" or transferred electron devices (TED's). TED's are two-valley bulk devices and not junction devices. Therefore, TED's do not suffer from speed limitations due to junction capacitance.

The structure and operation of two-valley devices are described in detail in a series of papers in the January 1966 issue of the IEEE Transactions on Electron Devices, Vol. ED-13, No. 1. As is set forth in these papers, a negative resistance can be obtained from a bulk semiconductor wafer of substantially homogeneous constituency having two energy band minima within the conduction band which are separated by only a small energy difference. By establishing a suitably high electric field across opposite ohmic contact of the semiconductor wafer, oscillations can be induced which result from the formation of discrete regions of high electric field intensity and corresponding space-charge accumulation, called domains, that travel from the negative to the positive contact at approximately the carrier drift velocity. A characteristic of the two-valley semiconductor material is that it presents a negative differential resistance to internal currents in regions of high electric field intensity. Hence, the electric field intensity of the domain grows as it travels toward the positive electrode.

Solid state oscillators of the "Gunn-effect" type have attracted widespread attention due to their small size and low cost as compared to other available microwave oscillator arrangements, e.g., klystrons, magnetrons, traveling wave tubes, etc. Essentially, such oscillators comprise a small specimen of particular semiconductive material having a multivalley conduction band system and capable of generating current oscillations in the microwave range when subjected to electric fields in excess of a critical, or threshold, intensity $E_T$. According to the present theory, a high electric field region, or domain, forms within the semiconductive specimen when subjected to electric fields in excess of a critical intensity $E_T$ due to a redistribution of electric fields within the specimen. Such redistribution of electric fields results from a transfer of charge carriers from a high mobility conduction band to a low mobility conduction band under the influence of applied electric fields in excess of the critical intensity $E_T$. A domain, when nucleated, is sustained and propagated along the semiconductive specimen by electric fields greater than a sustaining intensity $E_S$, which is less than the critical intensity $E_T$. The presence of a domain has the effect of reducing the overall conductance of the semiconductive specimen; the magnitude of current flow through the semiconductive specimen varies according to the presence and absence of a domain. Accordingly, a constant voltage of particular magnitude applied across the semiconductive specimen is effective to nucleate and propagate domains in successive, or cyclic, fashion whereby current through such specimen and, hence, along a series-connected load varies periodically in the form of coherent current oscillations. The theory of the "Gunn-effect" has been described more fully in "Theory of Negative-Conductance Amplification and of Gunn Instabilities in 'Two-Valley' Semiconductor" by D. E. McCumber et al., IEEE Transactions of Electron Devices, Vol. ED-13, No. 1, January 1966.

The frequency of current oscillations generated by oscillators of the "Gunn-effect" type operated in the traveling domain, or transit-time, mode depends upon the device length L and propagation velocity $v$ of the domains along the active region, i.e., $v/L$ where $v$ is about $10^7$ cm/sec. There is a further requirement for traveling domain oscillations in n-type gallium-arsenide that the product of the ionized donor density, $N_0$, and the device length, L, exceed $10^{12}$ $cm^{-2}$.

Heretofore, TED's have been used in circuits in which they have been supplied with direct current and have provided a microwave frequency output characteristic of the particular TED dimensions as disclosed in U.S. Pat. No. 3,365,583 to J. B. Gunn, and they have been used in amplifier circuits where they are supplied with an input whose frequency is the same as the characteristic frequency of the TED.

TED's have also been used in logic circuits, primarily as comparators. With regard to logic applications of TED's reference may be made to U.S. Pat. No. 3,594,618 issued to H. L. Hartnagel; "Theory of Gunn Effect Logic," Solid State Electronics, Vol. 12, pp. 19–30, 1969; to Toshiya Hayashi, "Three-Terminal GaAs Switches," IEEE Transactions of Electron Devices, Vol. ED-15, No. 2, pp. 105–110, February, 1968; and to T. Sageta, H. Yanai, and K. Sekido, "Schottky Gate Bulk Effect Digital Devices," Proc. IEEE (Letters), Vol. 59, No. 11, pp. 1629–1630, November, 1971.

SUMMARY OF THE INVENTION

Presented is a dynamic frequency divider comprising a TED chosen to provide a desired output frequency, the output frequency being variable over a limited range; biasing means connected to the TED which provides a voltage bias sufficient to maintain the electric field within the TED at a level greater than the domain-sustaining field but less than the threshold field of the TED; an input circuit tuned to receive an input signal of greater frequency than the output frequency; an output circuit tuned to the range of output frequency; and circuit means coupling the TED to the input and the output circuits.

DETAILED DESCRIPTION

Figure 1:
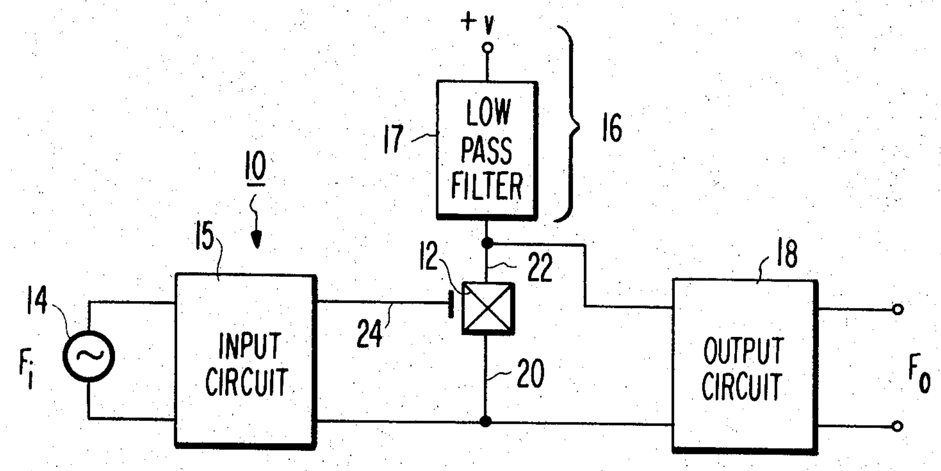
FIG. 1 is a schematic illustration of one embodiment of the present invention.

One embodiment of the dynamic division circuit 10 of the present invention is characterized by the circuit shown in FIG. 1. The division circuit 10 is constructed to have an output frequency $F_o$ when given an input frequency of $F_i$. The embodiment 10 comprises a three-terminal TED 12 such as those described by Gunn in U.S. Pat. No. 3,365,583 previously referred to, an input source 14, an input circuit 15 such as a waveguide or a coaxial cable, biasing means 16 which will preferably include a low pass filter 17, and an output circuit 18 such as a waveguide or a coaxial cable.

Figure 2:
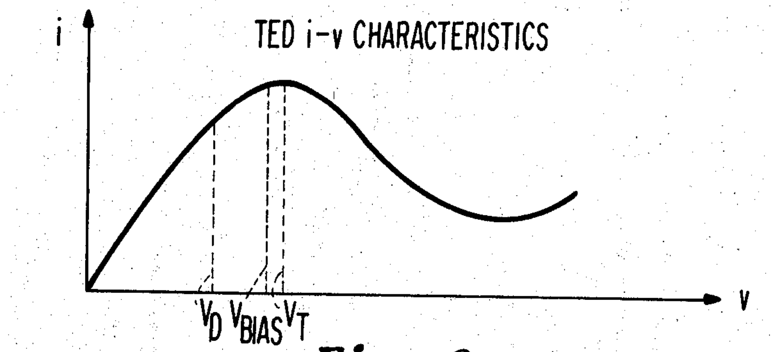
FIG. 2 is a graph of the current-voltage relationship in a TED.

The TED 12 is chosen to have a characteristic output frequency of $F_o$. If the biasing means 16 is adjusted to supply a bias voltage just below the threshold voltage, $V_T$, of the TED 12, typically 0.9–0.95 $V_T$, and above the domain sustaining voltage $V_D$ of the TED 12, as shown in the i-v relationship for the TED of FIG. 2, and the input source 14 is used to supply an input frequency, $F_i$, of frequency $3F_o$ at an amplitude sufficient to establish an electric field of a magnitude greater than the threshold field needed to form domains within the device, an output frequency of $F_o$ will be presented at the output of the circuit 10. Thus, the circuit will be dynamically dividing the input frequency, $F_i$ by the integer 3.

The TED 12 comprises a cathode terminal 20, an anode terminal 22, and a gate terminal 24. The TED has a length L which determines its characteristic oscillating frequency according to the formula:

$$F=NV/L$$

wherein $N$ is an integer and $V$ is the velocity with which domains travel from one terminal to the other and is approximately equal to $10^7$ centimeters per second which is approximately equal to the drift velocity of the electrons at the threshold value of the field related to $V_T$, the threshold voltage at which oscillations first appear in a particular TED. Usually, the frequency given by $N$=1 is the only term present, but harmonics up to $N$=5 have sometimes been found. For our purposes hereinafter, only the $N$=1 term will be considered as harmonics will be suppressed by the filtering of the tuned output circuit 18.

The input source 14 is used to supply an input of greater frequency than the characteristic frequency $F_o$ of the TED 12. If, for example, an input frequency $F_i$, of $3F_o$ is supplied to the gate 24 of the TED 12 and is of a magnitude sufficient when added to the field created by the bias voltage imposed upon the TED 12, $V_{BIAS}$ shown in FIG. 2, which is typically 0.9–0.95 $V_T$, the field within the TED 12 will be of sufficient magnitude to nucleate a domain within the TED 12. As long as a voltage greater than the domain sustaining voltage, $V_D$, is imposed across the TED 12 the input voltage supplied by the input source 14 cannot nucleate a second domain until such time as the first nucleated domain has been collected at the anode 22. This means that when the input source 14 has gone through a complete cycle at a frequency of $3F_o$ the first nucleated domain has traveled only part of the way, in this example one-third of the way, down the length of the TED 12. Thus, when the input source 14 supplies the second positive input to the gate 24 of the TED 12, a second domain cannot be nucleated from the cathode 20 because the first domain has not yet been collected at the anode 22 of the TED 12. However, when the input source 14 has gone through a third complete cycle, the first domain nucleated at the cathode 20 will be collected at the anode 22 of the TED 12. Thus, the TED 12 can again nucleate a domain at its cathode 20. The circuit operation described will be repeated with a resulting dynamic division by three. This is called dynamic division because the output frequency of the circuit 10 is the input frequency divided down by an integral factor with the factor being three in this case. This is not a true flip-flop division circuit due to limitations on the bandwidth imposed by the particular TED 12 and output circuit 18 of the division circuit 10. However, this dynamic division circuit 10 can be used in applications requiring division in multi-gigabit rates which have not heretofore been achieved using silicon logic technology. It has been found experimentally that there exists a range of input frequencies around $3F_o$ which can be successfully used in a particular TED with dynamic divide-by-three results.

Figure 3:
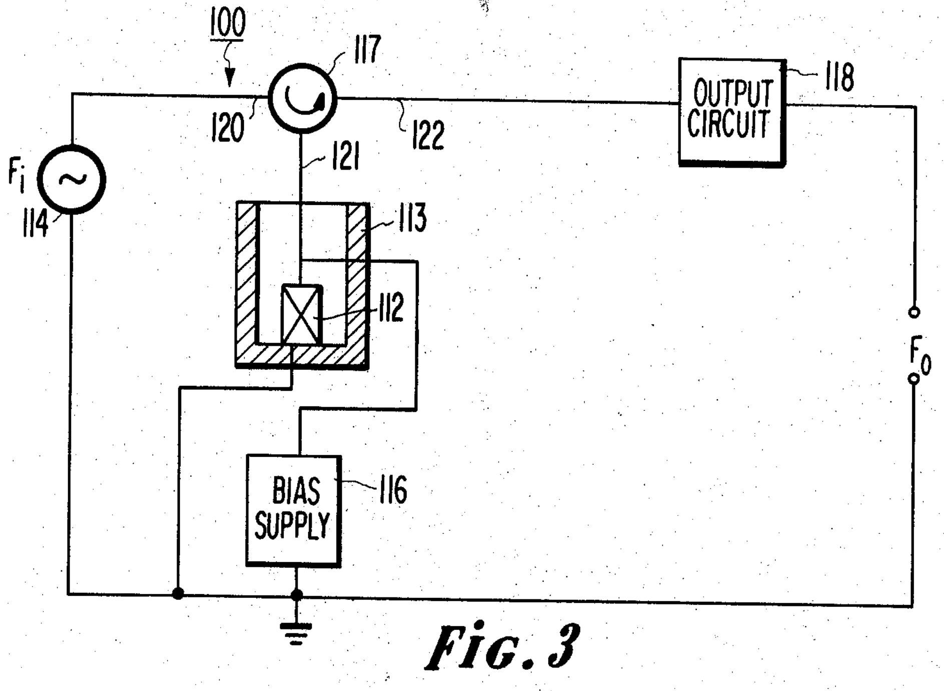
FIG. 3 is a schematic illustration of another embodiment of the present invention.

Referring generally to FIG. 3, a second embodiment 100 of the present invention is shown. This embodiment 100 comprises a two-terminal TED 112 mounted in a tuned cavity 113, an input source 114, biasing means 116, a circulator 117, and an output circuit 118. The basic differences between this embodiment 100 and the embodiment 10 shown in FIG. 1 are that this circuit 100 uses a circulator 117 and a two-terminal TED 112 instead of a three-terminal TED 12 as used in the embodiment 10 shown in FIG. 1. The operation of the circulator 117 is such that when a signal is connected to its first port 120 the circulator 117 will direct the signal out of its second port 121. A signal imposed upon the second port 121 of the circulator 117 will be directed out the third port 122 and a signal directed into the third port 122 of the circulator 117 will be directed out of the first port 120. When a signal is imposed upon the first port 120 of the circulator 117 from the input source 114 it will be directed into the cavity 113 containing the biased TED 112. Assuming the signal from the input source 114 is of sufficient magnitude to cause the TED 112 to oscillate at its characteristic frequency $F_o$ the TED 112 will do so and send an output signal back through the circulator 117 and into the output circuit 118. Similar to the operation of the embodiment 10 shown in FIG. 1, if the input source 114 oscillates at a frequency, $F_i$, within a range of approximately $3F_o$, the TED 112 will oscillate at a frequency within a range of about $F_o$, and an output frequency of approximately $F_o$ and approximately equal to one-third the input frequency will be imposed upon the output circuit 118.

As will be understood by one skilled in the relevant art the examples given of the preferred embodiment, are merely given as illustrative of one embodiment of the invention. The present invention has been shown to be capable of dynamic division by other integers by merely changing the input frequency, $F_i$, to a frequency $nF_o$, for $n$ an integer and by making appropriate changes in the tuning of the input circuitry.

Also as will be understood by one skilled in the art, while transit time oscillations of the TED have been discussed, other oscillation modes such as accumulation layer mode, dipole layer mode, or other circuit controlled modes of oscillation can be used without departing from the disclosed invention.

We claim:

1. A dynamic frequency divider comprising:

a. a transferred electron device chosen to oscillate at a desired output frequency;

b. biasing means connected to said transferred electron device which provide a voltage bias sufficient to maintain the electric field within said transferred electron device at a level greater than the domain-sustaining field but less than the threshold field of said transferred electron device;

c. an input circuit tuned to receive an input signal which is an integral multiple of said output frequency, said integral multiple being at least three times said output frequency;

d. an output circuit responsive to said output frequency; and e. circuit means coupling said transferred electron device to said input circuit and said output circuit.

2. The dynamic frequency divider of claim 1 wherein said transferred electron device comprises a three-terminal transferred electron device.

3. The dynamic frequency divider of claim 2 wherein said three terminals of said transferred electron device comprise:

a. a gate terminal electrically connected to said input circuit;

b. an anode terminal electrically connected to said biasing means and to said output circuit; and c. a cathode terminal electrically connected to said input circuit and to said output circuit.

4. The dynamic frequency divider of claim 3 wherein said biasing means comprises a voltage source electrically connected through a low pass filter to said anode terminal of said transferred electron device.

5. The dynamic frequency divider of claim 1 wherein said transferred electron device comprises a two-terminal transferred electron device.

6. The dynamic frequency divider of claim 5 wherein said two-terminal transferred electron device is mounted in a tuned cavity.

7. The dynamic frequency divider of claim 6 further comprising a microwave circulator, said circulator having:

a. a first port connected to said input signal;

b. a second port connected to said transferred electron device mounted in said tuned cavity; and c. a third port electrically connected to said output circuit.

8. The dynamic frequency divider of claim 7 wherein said biasing means comprises a voltage source in series with a low pass filter and said transferred electron device.

9. The dynamic frequency divider of claim 2 wherein said transferred electron device and said output circuit are tuned to said output frequency and said input circuit is tuned to a frequency greater than that of said output frequency.

10. The dynamic frequency divider of claim 9 wherein said input frequency is three or more times that of said output frequency.

11. The dynamic frequency divider of claim 9 wherein said input circuit comprises a waveguide tuned to said input frequency.

12. The dynamic frequency divider of claim 9 wherein said output circuit comprises a waveguide tuned to said output frequency.

13. The dynamic frequency divider of claim 9 wherein said input circuit comprises a coaxial line tuned to said input frequency.

14. The dynamic frequency divider of claim 9 wherein said output circuit comprises a coaxial line tuned to said output frequency.

* * * * *